United States Patent [19]
Lee et al.

[11] Patent Number: 6,163,192
[45] Date of Patent: Dec. 19, 2000

[54] NEGATIVE PULSE EDGE TRIGGERED FLIP-FLOP

[75] Inventors: Lan Lee, Palo Alto; Hiep P. Ngo, Sunnyvale; Cong Khieu, San Jose., all of Calif.

[73] Assignee: Sun Microsystems, Inc., Palo Alto, Calif.

[21] Appl. No.: 09/259,148

[22] Filed: Feb. 26, 1999

[51] Int. Cl.[7] .................................................. H03K 3/356
[52] U.S. Cl. ............................................ 327/212; 327/208
[58] Field of Search ..................................... 327/199, 200, 327/201, 208, 210, 211, 212, 214, 215

[56] References Cited

U.S. PATENT DOCUMENTS

| 5,793,236 | 8/1998 | Kosco | 327/212 |
|---|---|---|---|
| 5,898,330 | 4/1999 | Klass | 327/210 |
| 5,973,531 | 10/1999 | Kim et al. | 327/200 |

*Primary Examiner*—Toan Tran
*Assistant Examiner*—Paul Dinh
*Attorney, Agent, or Firm*—William S. Galliani; Pennie & Edmonds LLP

[57] ABSTRACT

A negative edge triggered flip-flop generates an output pulse in response to a negative edge of a clock signal. A first set of nodes receives data input signals, and a second set of nodes receives select input signals for selecting one data input signal as a selected data input signal. The clock node receives the clock signal which has a positive edge and a negative edge. A header circuit connects to the second set of nodes and to the clock node, and integrates the clock signal with the select input signals to generate at least one control signal. A pulse generator circuit connects to the first set of nodes, the header circuit and the output node. The pulse generator circuit generates an output pulse on the output node in response to a control signal and the selected data input signal.

20 Claims, 7 Drawing Sheets

NEGATIVE PULSE EDGE TRIGGERED FLIP-FLOP

BRIEF DESCRIPTION OF THE INVENTION

This invention relates generally to flip-flops. More particularly, this invention relates to a high speed negative pulse edge triggered flip-flop.

BACKGROUND OF THE INVENTION

Digital circuits, such as microprocessors and memories, typically use flip-flops as temporary storage devices. As digital circuits, particularly microprocessors and memories, operate at ever faster speeds, demand for faster flip-flops increases.

A flop-flip has two stable states and changes from one state to another with the application of a clock signal. The clock signal has a positive edge and a negative edge. The positive edge of the clock signal means that the clock signal is transitioning from a low voltage level to a high voltage level. The negative edge of the clock signal means that the clock signal is transitioning from a high voltage level to a low voltage level. The low voltage level represents a digital or logical zero value, while the high voltage level represents a digital or logical one value.

A pulsed flip-flop has one stable state and outputs a pulse if a data input signal has a predetermined voltage level in response to the positive edge of the clock signal. Referring to FIG. 1, one prior art pulsed flip-flop 20 outputs a pulse on the positive edge of the clock signal that is supplied on the clock node 22. To have the flip-flop 20 operate synchronously with respect to the negative edge of the clock signal, an inverter 24 inverts the clock signal supplied to the flip-flop 20. However, the inverter 24 increases circuit complexity and increases the amount of time required for the clock signal to propagate through the flip-flop circuitry.

In the prior art flip-flop 20, an input multiplexor 30 receives data input signals (d0, d1) at data nodes 32, 34, select input signals (select 0, select 1) at select nodes 36, 38 and the clock signal at the clock node 22. The input multiplexor 30 connects to an output pulse driver circuit 40. The data input signals, select input signals and the clock signal are not directly supplied to the output pulse driver circuit 40. The output pulse driver circuit 40 receives an evaluation (eval) signal from the input multiplexor 30 at node 42 and a complementary evaluation signal (eval_c) at node 44. The output pulse driver circuit 40 outputs a pulse in response to the evaluation and the complementary evaluation signals. In addition, the output pulse driver circuit 40 supplies feedback signals, window and windowc to the input multiplexor 30 via NMOS transistors 46 and 48, respectively.

One of the data nodes 32, 34, supplies the data input signal, (d0, d1 to an inverter, 50, 52, respectively. One of the select nodes 36, 38, supplies the select input signal, select 0, select 1, to an inverter 54, 56, respectively.

The input multiplexor 30 has data select blocks 58, 60. The data select blocks 58, 60 are the same except that different signals are input; therefore, only the operation of data select block 58 will be described. In data select block 58, a NOR gate 62 receives the inverted select 0 and d0 signals from inverters 54 and 50, respectively. Another NOR gate 64 receives the inverted select 1 and d1 signals from inverters 56 and 52, respectively. The output of the NOR gates 62, 64 is supplied to the gates of NMOS transistors 66 and 68, respectively, which are connected in parallel and act as a pull-down circuit 70.

The clock signal is supplied to the gate of NMOS transistor 71. When the clock signal has a digital high value, NMOS transistor 71 will turn on and allow the transistor 66, 68 to act as a pull-down circuit which will cause the evaluation signal to have a digital low value under certain conditions. In particular, the evaluation signal will have a digital low value when:

the d0 and select 0 signals have a digital high value,
the inverted clock signal at transistor 71 has a digital high value, and
the window signal at the gate of transistor 46 has a digital high value.

The window signal is typically at a digital high value and transistor 46 is typically on. Because of the operation of the output pulse driver circuit 40, which will be explained below, the evaluation signal is precharged to a digital high.

The output pulse generator 40 generates output signals Q and $\overline{Q}$, on output nodes 72 and 74, respectively. Typically, Q and $\overline{Q}$ have a digital low value. Either Q or $\overline{Q}$ will output a pulse when the selected data input signal has a digital high value. Q and $\overline{Q}$ will not output a pulse simultaneously.

To generate the Q signal, a pair of cross-coupled inverters 76, 78, acts as a latch to store the state of the evaluation signal, which is typically a digital high value. The evaluation signal is also supplied to an inverter 80 which outputs the Q signal on output node 72. When the evaluation signal has a digital high value, inverter 80 outputs a Q signal with a digital low value.

The window signal is generated by a NOR gate 81a based on the state of a scan enable signal from scan enable logic 81b and a feedback evaluation signal (fb_eval) from the $\overline{Q}$ signal generation logic. In this description, the scan enable signal is disabled with a digital low value and the output of the scan enable logic 81b is also a digital low value which does not affect the operation of the circuit. The scan enable signal and logic are used to test the circuitry. The window signal is therefore responsive to the feed back evaluation signal. When the $\overline{Q}$ signal is a logical one, the feedback evaluation signal will also be a logical one value causing the window signal to have a logical zero and turning off transistor 46. When the $\overline{Q}$ signal is a logical zero, the feed back evaluation signal will be a logical zero causing the window signal to have a logical one value and turning on transistor 46.

Within the output pulse generator 40, a reset circuit also controls the state of the evaluation signal based on the state of the Q and $\overline{Q}$ signals. When the Q and $\overline{Q}$ signals have a digital low value, a NOR gate 82 outputs a digital high value to an inverter 84 which supplies a digital low value to NAND gate 86. The NAND gate 86 generates a n-reset signal with a digital high value. The gate of a PMOS transistor 88 receives the p-reset signal. The source and drain of the PMOS transistor 88 connect to $V_{dd}$ and the evaluation signal at node 42, respectively. Since the supply voltage, $V_{dd}$, has a digital high value and the gate of the PMOS transistor 88 has a digital high value, PMOS transistor 88 remains inactive.

The p-reset signal is also supplied to another inverter 90 which generates an n-reset signal at node 92 which is supplied to the gate of another NMOS transistor 94. When the p-reset signal has a digital high value, NMOS transistor 94 remains inactive and does not affect the voltage level of the Q signal and the p-reset signal remains in this quiescent state.

A separate reset signal is supplied to NAND gate 86 to force the flip-flop to output Q and $\overline{Q}$ signals. This description assumes that the reset signal is a digital high value and therefore is inactive.

When the evaluation signal has a digital low value, the output pulse generator and the reset circuit become active and output a pulse. In particular, when the evaluation signal has a digital low value, the cross-coupled inverters 76, 78 latch the digital low value. Simultaneous with the latching of the digital low value, inverter 80 outputs a digital high value as the Q signal.

The digital high Q signal causes the reset circuit and p-reset signal to become active. The digital high Q signal causes the signal on node 45 (i.e., the window signal) to have a digital low value, thus turning off transistor 46 and effectively isolating the input multiplexor 30 from the output pulse generator 40.

The digital high Q signal on node 72 causes the NOR gate 82 to output a digital low value to inverter 84, which supplies a digital high value to NAND gate 86. Since both inputs of NAND gate 86 are at a digital high, the p-reset signal has a digital low value. PMOS transistor 88 receives the digital low p-reset signal, turns on and causes the evaluation signal to have a digital high value which flows through inverter 80 to output a digital low Q signal on node 72. The cross-coupled inverters 76, 78 latch the digital high value.

Meanwhile, also in response to the digital high Q signal, the p-reset signal causes inverter 90 to output a digital high value. In response, transistor 94 turns on and pulls the Q signal to a digital low value.

The generation of a $\overline{Q}$ signal on node 74 is the same as that for the Q signal described above, except that the complement of the data signals, $\overline{d0}$ and $\overline{d1}$, is used.

The prior art positive edge triggered flip-flop of FIG. 1 is complex. In addition, this prior art flip-flop has a relatively long propagation time. Including inverter 24, there are six gate delays between the negative edge of the clock signal and the positive edge of the Q signal's output pulse.

It would be desirable to provide a negative pulse edge triggered flip-flop with reduced circuit complexity and reduced propagation time. To further reduce circuit complexity, a negative pulse edge triggeredflip-flop which eliminates the need for a window signal is also desirable.

SUMMARY OF THE INVENTION

A negative edge triggered flip-flop has a header circuit and a pulse generator circuit. The header circuit integrates a clock signal with select input signals to generate at least one control signal. In response to the control signal, the pulse generator circuit generates an output pulse synchronized to the negative edge of the clock signal.

In a particular embodiment of the invention, a first set of nodes receives data input signals, and a second set of nodes receives select input signals for selecting one data input signal as a selected data input signal. The clock node receives the clock signal which has a positive edge and a negative edge. A header circuit connects to the second set of nodes and to the clock node, and integrates the clock signal with the select input signals to generate a control signal. A pulse generator circuit connects to the first set of nodes, the header circuit and the output node. The pulse generator circuit generates an output pulse on the output node in response to the control signal and the selected data input signal, such that the output pulse is generated in response to the negative edge of the clock signal.

The invention reduces circuit complexity by integrating the clock signal with the select input signals, and by eliminating the need for a feedback signal from the output pulse generator to the header circuit. The number of gates that the clock signal transitions through is also reduced. Therefore, performance is improved.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 2:
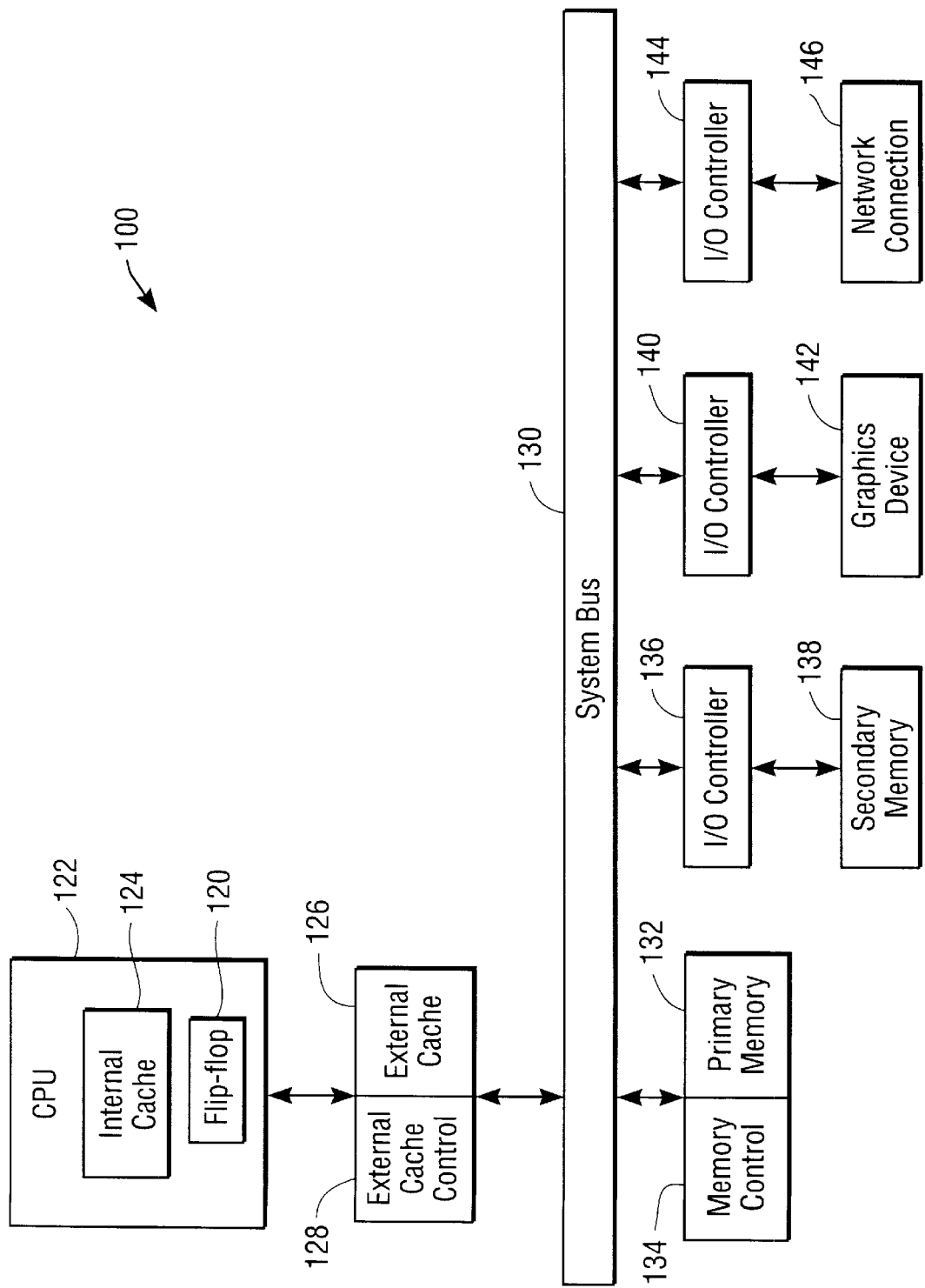
FIG. 2 illustrates a general purpose computer incorporating the negative edge triggered flip-flop of the present invention.

FIG. 2 illustrates a general purpose computer 100 incorporating the negative edge triggered flip-flop 120 of the invention in the central processing unit (CPU) 122. However, the negative edge triggered flip-flop 120 may be implemented in any number of the devices shown in FIG. 2. By way of example, the negative edge triggered flip-flop 120 may be used in the internal cache 124 of the CPU 122.

As known in the art, the CPU 122 executes instructions of a computer program. Each instruction is located at a memory address. Similarly, the data associated with an instruction is located at a memory address. The CPU 122 accesses the specified memory address to fetch the instruction or data stored there.

Most CPUs 122 include an on-board memory called an internal cache 124. The internal cache 124 stores a set of memory addresses and the instructions or data associated with the memory addresses. The negative edge triggered flip-flop 120 is used to store the set of memory addresses and the corresponding instructions or data.

If a specified address is not in the internal or L1 cache 124, the CPU 122 looks for the specified address in an external cache 126, also called an L2 cache. The external cache 126 has an associated external cache controller 128. The external cache controller 128 may also use the negative edge triggered flip-flop 120 of the invention.

If the address is not in the external cache 126 (a cache miss), the external cache controller 128 requests access to a system bus 130. When the system bus 130 becomes available, the external cache controller 128 is allowed to route its address request to the primary memory 132. The primary memory 132 has an associated memory controller 134. The memory controller 134 queries the primary memory 132 for the subject address. If the subject address exists in primary memory 132, the data output from the primary memory 132 is applied to the system bus 130. From the system bus 130, the data is stored in the external cache 126 and is passed to the CPU 122 for processing.

The foregoing processing is performed for every address request. If the address request is not found in the primary memory 132, similar processing is performed by an input/output controller 136 associated with the secondary memory 138.

As shown in FIG. 2, additional devices connect to the system bus 130. For example, FIG. 2 illustrates an input/output controller 140 operating as an interface between a graphics device 142 and the system bus 130. In addition, the figure illustrates an input/output controller 144 operating as an interface between a network connection circuit 146 and the system bus 130. The negative edge triggered flip-flop 120 may be used in any of the devices shown in FIG. 2.

Figure 3:
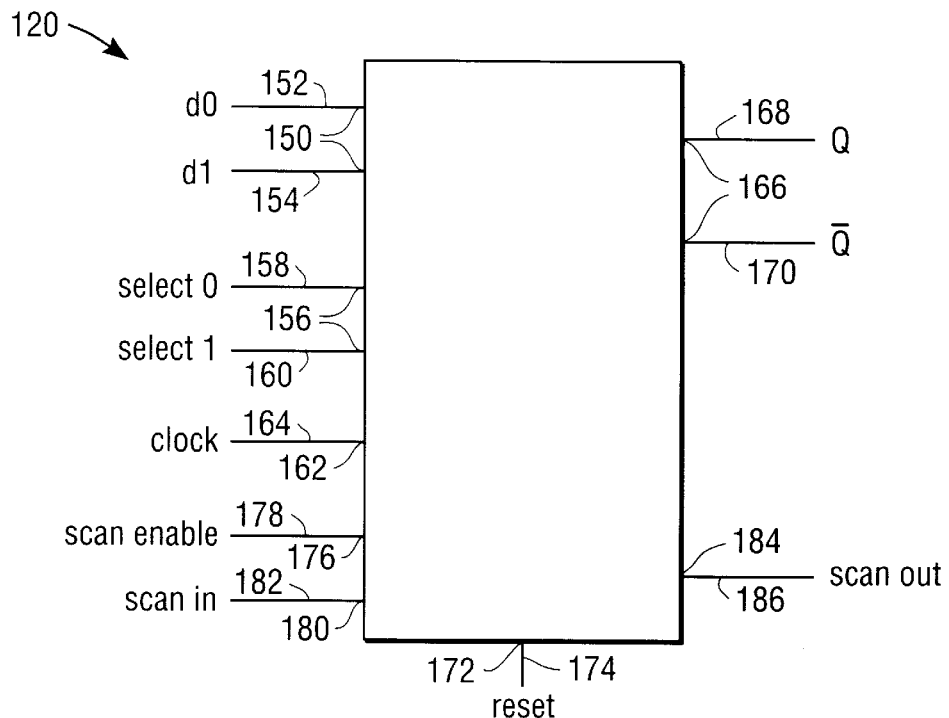
FIG. 3 illustrates the input and output nodes of the negative edge triggered flip-flop of the present invention.

FIG. 3 is a general illustration of a negative edge triggered flip-flop 120 in accordance with the invention. The negative edge triggered flip-flop 120 includes data input nodes 150 that are used to receive data signals, d0 and d1 from lines 152 and 154, respectively. Select input nodes 156 are used to receive select signals, select 0 and select 1, from lines 158 and 160, respectively. A clock input node 162 receives a clock signal from line 164. The negative edge triggered flip-flop 120 also includes output nodes 166 to output Q and $\overline{Q}$ signals on lines 168 and 170, respectively. In addition, a reset node 172 receives a reset signal on line 174, to force the Q and $\overline{Q}$ signals to a predetermined state.

Other inputs to the negative edge triggered flip-flop 120 are shown and will not be described in detail because they are outside the scope of this invention, but part of the context in which the invention operates. These other inputs include: a scan enable input node 176 for receiving a scan enable signal on line 178, a scan input node 180 for receiving a series of data to scan in to the flip-flop on line 182, and a scan out node 184 for outputting the scanned input data on line 186. As known in the art, these nodes are used to perform boundary scan testing operations in accordance with known standards.

Figure 4:
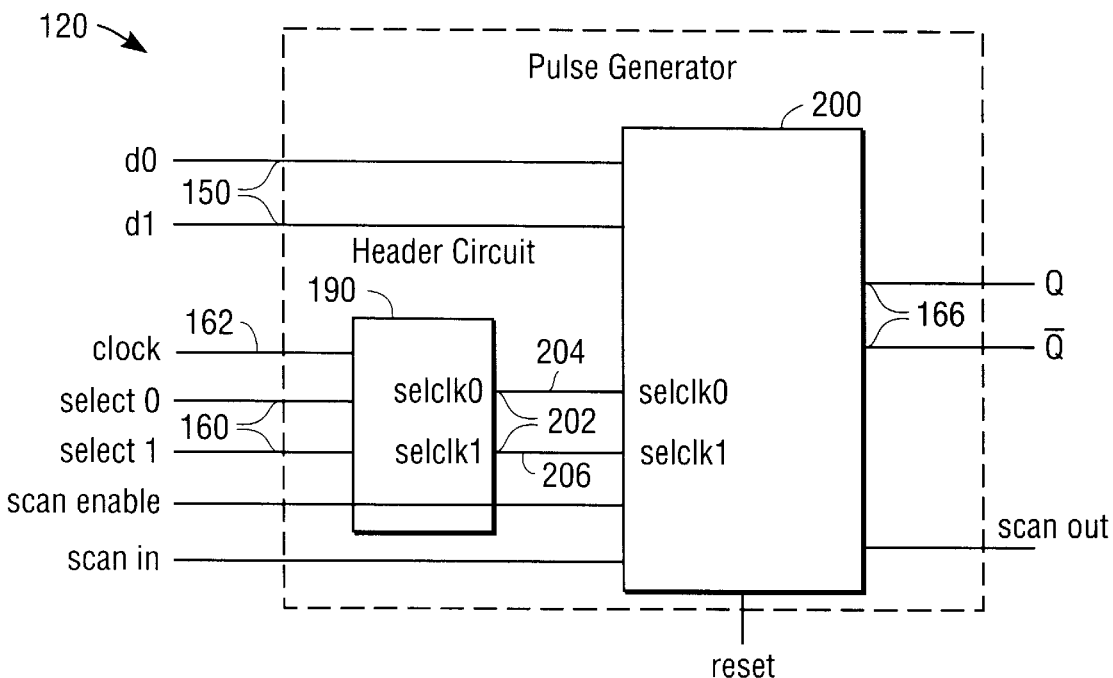
FIG. 4 illustrates the flip-flop of FIG. 3 in more detail.

As shown in FIG. 4, the negative edge triggered flip-flop 120 includes a header circuit 190 connected to a pulse generator circuit 200. In a particularly noteworthy aspect of the invention, the header circuit 190 outputs control signals, referred to as select-clock signals, on the header output nodes 202 by integrating the clock signal with the select input signals. The header circuit 190 connects to the select input nodes 160 and to the clock node 162, and outputs the select clock signals, selclk0 and selclk1, on lines 204 and 206, respectively. Typically the select-clock signal is a digital low value. The select-clock signal may transition to a digital high value, that is, become active-high, on the negative edge of the clock signal. The term "active-high" means that the pulse generator circuit 200 is capable of responding to a selected data input signal when the corresponding select-clock signal has a digital high value. If the select-clock signal has a digital low value, the pulse generator circuit will not respond to the associated data input signal.

The pulse generator circuit 200 connects to the data input nodes 150, the header circuit output nodes 202 on lines 204 and 206, and the output nodes 166. In response to the control signal(s), selclk0 and selclk1, the pulse generator circuit 200 generates an output pulse on the Q or $\overline{Q}$ signal. Therefore, the output pulse is generated in response to the negative edge of the clock signal.

In this way, by integrating the clock signal with the select input signals in the header circuit, the invention reduces circuit complexity and eliminates the need for a feedback signal from the output pulse generator 200 to the header circuit 190.

Figure 5:
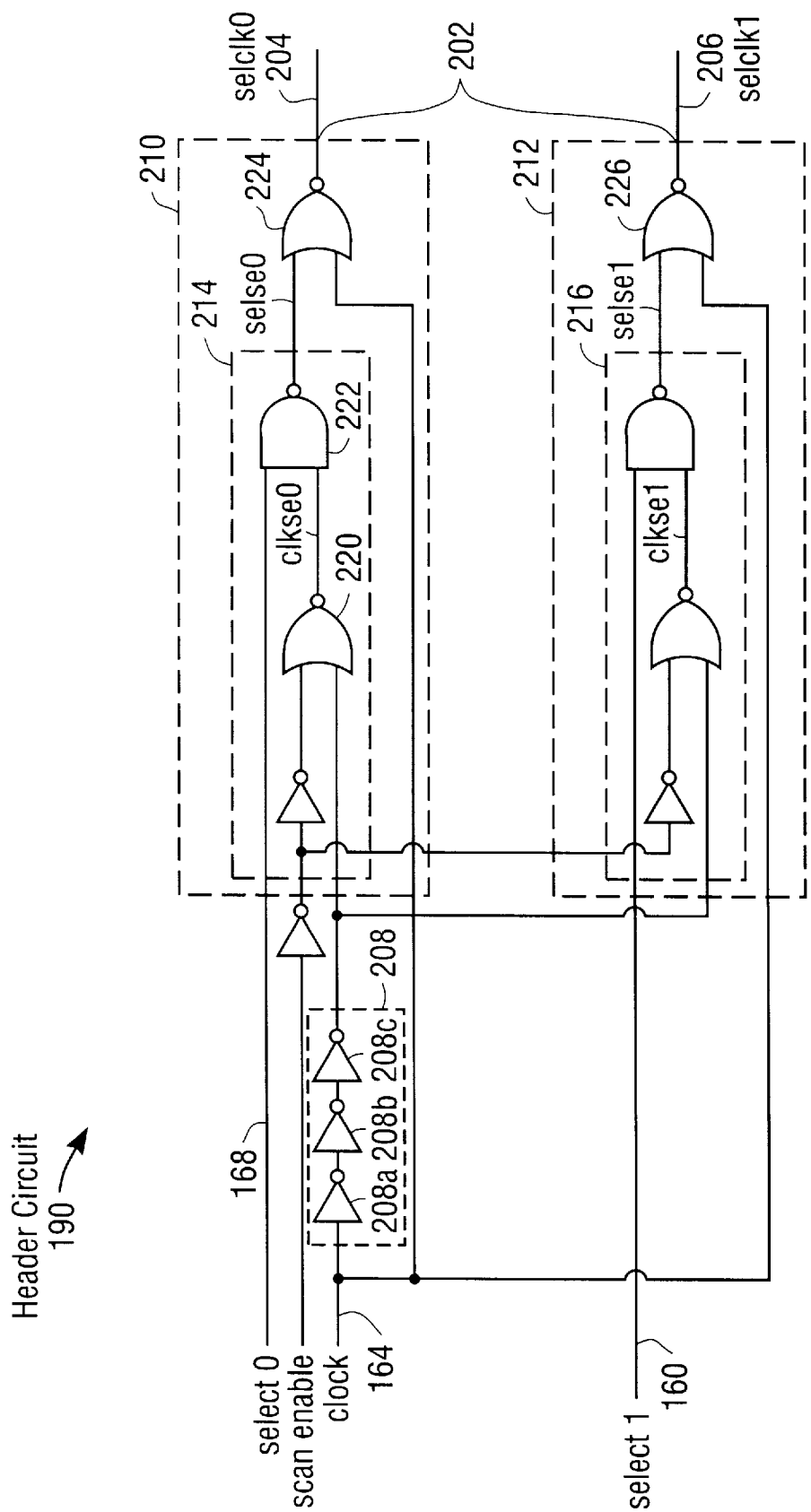
FIG. 5 is a schematic diagram of a header circuit constructed in accordance with an embodiment of the invention shown in FIG. 4.

FIG. 5 illustrates an embodiment of the header circuit 190. The clock signal is supplied on line 164 to a clock delay block 208 that generates a delayed clock signal. In the clock delay block 208, the clock signal is supplied to three inverters 208a, 208b and 208c, connected in series, to generate a predetermined amount of delay between the clock signal and the delayed clock signal.

In another noteworthy aspect of the invention, each one of a set of select-clock signal generators 210, 212 generates one of the select-clock signals (selclk0, selclk1). Each select-clock signal generator 210, 212 uses two stages to generate the select clock signals. In the first stage 214, 216, one of the select input signals, select 0 and select 1, is combined with the scan enable signal and the delayed clock signal to generate a select-enable signal, selse0 and selse1, to supply to the second stage 224, 226, respectively. The second stage 224, 226 combines the select-enable signal with the clock signal to generate the select-clock signal.

Throughout this description, the scan enable signal is in an inactive state with a digital low value. When the clock signal has a digital low value, an inverter 218 supplies a digital high value to a NOR gate 220 which outputs a digital low value to a NAND gate 222. In response to the digital low value, the NAND gate 222 generates the select-enable signal with a digital high value.

When the clock signal has a digital high value, the clock delay block 208 supplies a digital low value to the NOR gate 220 which outputs a digital high value to the NAND gate 222. In response to the digital high value, the NAND gate 222 generates the select-enable signal with a digital low value. Note that a digital low value on the select-enable signal indicates that the corresponding data signal is the selected data signal.

In the second stage 224, 226, a NOR gate 224, 226, combines or integrates the select-enable signal with the clock signal to generate the select-clock signal, selclk0, selclk1, respectively. The NOR gate 224, 226, will generate a high level voltage when both the select-enable signal and the clock signal have low voltage levels. Since the clock signal is combined with the delayed clock signal, there will be a predetermined period of time during which both the clock signal and the select-enable signal have a digital low value. This predetermined period occurs at the negative edge of the clock signal and is a function of the amount of delay supplied by the clock delay block 208, NOR gate 220 and NAND gate 222.

In an alternate embodiment, the clock delay block 208 has five inverters. Alternately, the clock delay block 208 has one inverter. Generally, the clock delay block 208 should have an odd number of inverters.

Figure 6:
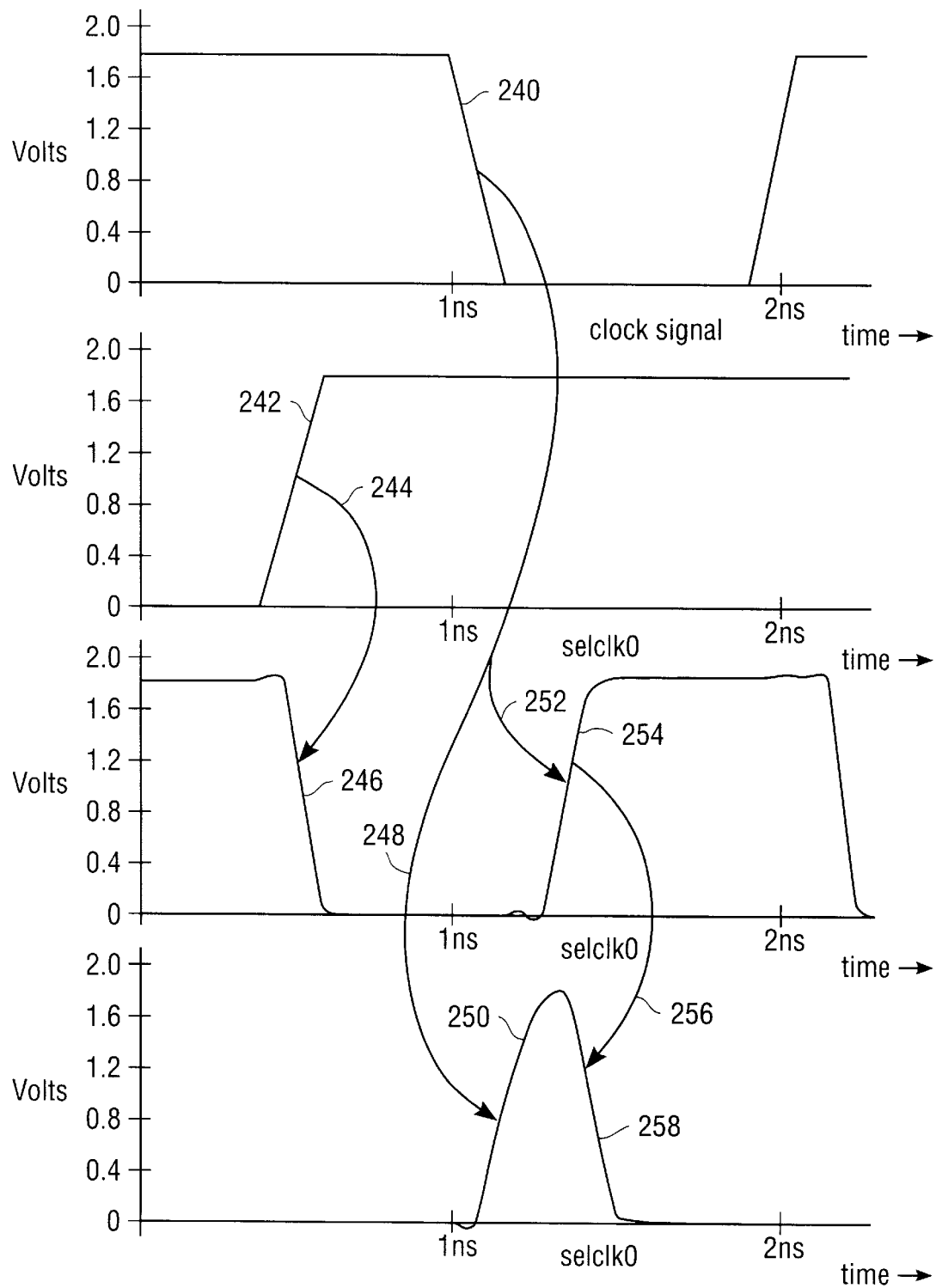
FIG. 6 is a timing diagram of the header circuit of FIG. 5 and the flip-flop of FIG. 4 in accordance with an embodiment of the invention shown in FIG. 4.

As shown in FIG. 6 in a timing diagram of the header circuit of FIG. 5, the negative edge 240 of the clock signal is shown. Prior to the negative edge 240 of the clock signal, the select 0 signal transitions from a digital low value to a digital high value at 242. As shown by arrow 244, in response to the clock signal having a digital high value and the select 0 signal transitioning to a digital high value, the select-enable signal (selse0) transitions to a digital low value at 246. Meanwhile, in response to the negative edge 240 of the clock signal, as shown by arrow 248, the NOR gate 224, 226 (FIG. 5) outputs a select-clock 0 signal (selclk0) which transitions from a digital low value to a digital high value at 250. However, the select-enable signal of the first stage 214, 216 (FIG. 5) is also responsive to the negative edge 240 of the clock signal, as shown by arrow 252. Therefore, the select-enable signal transitions from a digital low value to a digital high value at 254. In response to the transition at 254 of the select-enable signal, as shown by arrow 256, the select-clock 0 signal transitions from the digital high value to a digital low value at 258.

In this way, the header circuit 190 of the present invention efficiently and effectively provides a select-clock signal that is synchronized to the negative edge of the clock signal. Each select-clock signal generator is capable of generating a select-clock signal with an active high pulse in response to the negative edge of the clock signal.

Figure 7:
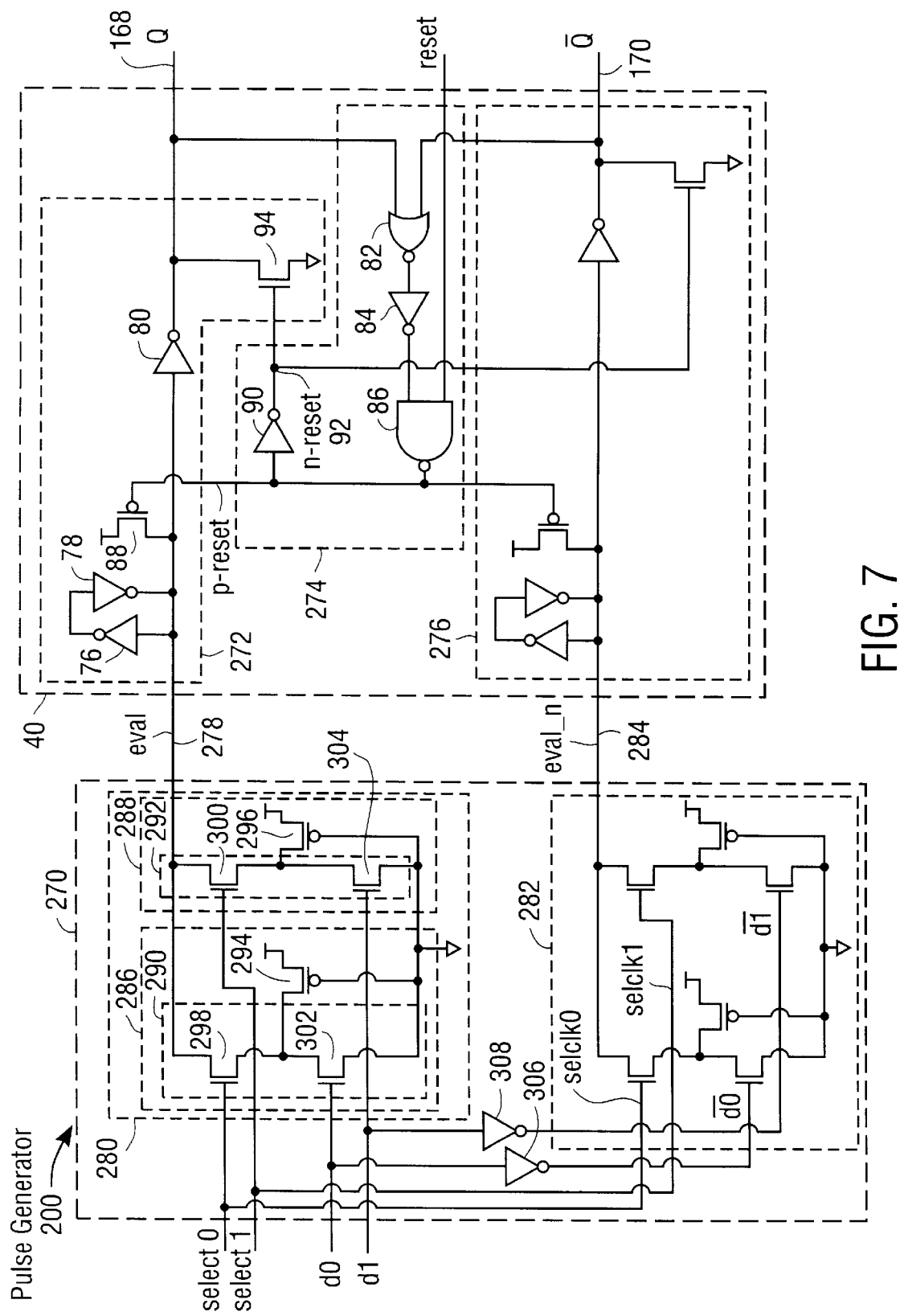
FIG. 7 is a schematic diagram of a pulse generator constructed in accordance with an embodiment of the invention shown in FIG. 4.

In FIG. 7, a pulse generator circuit 200 has a multiplexor 270 connected to an output pulse driver circuit 40. The multiplexor 270 combines the select-clock signals with the data input signals to generate an evaluation signal, called eval at line 278 which is supplied to the output pulse driver circuit 40. This evaluation signal is active low. In other words, when the evaluation signal has a digital low value, the Q signal will output a pulse with a digital high value.

Figure 1:
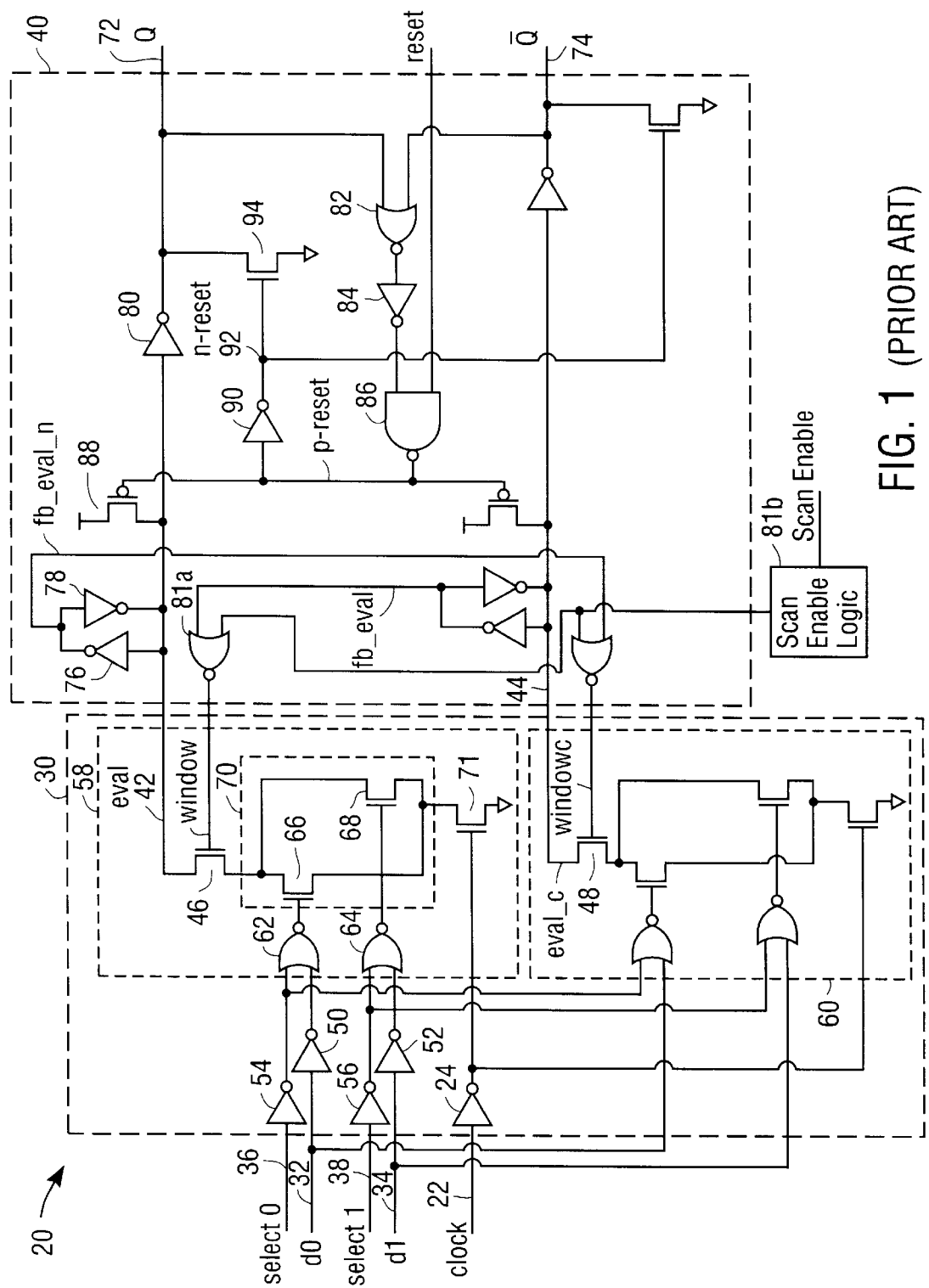
FIG. 1 illustrates a pulsed flip-flop of the prior art.

Note that the output pulse driver circuit 40 is substantially the same as the prior art output pulse driver circuit 40 shown in FIG. 1. The only difference between the circuits is that the circuit of FIG. 7 does not include a feedback path as discussed below. In the output pulse driver circuit 40, a dynamic pulse generation circuit includes a first driver block 272 and a reset circuit 274. A second driver block 276 is the same as the first driver block 272. The first driver block 272 drives the Q signal, while the second driver block 276 drives the $\overline{Q}$ signal. Since the output pulse driver circuit 40 has already been described above, the description will not be repeated.

In another significant aspect of the invention, the multiplexor circuit 270 supplies the evaluation signals (eval, eval_n) to the output pulse driver circuit 40. Unlike the prior art circuit of FIG. 1, the feedback loop from the output pulse driver circuit 40 is not required. No window signal is supplied to the multiplexor circuit 270 to isolate the multiplexor 270 from the output pulse driver circuit 40. Because the select clock signal is a short duration pulse, synchronized to the negative edge of the clock signal, the need for a window signal is eliminated. In this way the complexity of the flip-flop is reduced.

The multiplexor circuit 270 has pull-down circuits 280, 282, that generate the eval and eval_n signals at nodes 278 and 284, respectively. Each pull-down circuit 280, 282 is coupled to the data input nodes to receive the data input signals, and outputs a digital low value when one of the data input signals and one of the select-clock signals are at a digital high value. Since the pull-down circuits 280, 282 are the same, only pull-down circuit 280 will be described.

In the pull-down circuit 280, data-select blocks 286, 288 are connected in parallel. Each data select-block 286, 288 includes a stacked transistor pair 290, 292 coupled to a PMOS precharge transistor 294, 296. In the stacked transistor pairs 290, 292, a first NMOS transistor 298, 300 and a second NMOS transistor 302, 304 are connected in series. The gate of first transistor 298, 300 is coupled to one of the header output nodes to receive one of the select-clock signals, selclk0, selclk1, respectively. The gate of second transistor 302, 304 is coupled to one of the data input nodes to receive one of the data input signals, (d0, d1 respectively. The source of the second transistor 302, 304 connects to ground. The drains of the first transistor 298, 300 connect to line 278 to control the evaluation signal.

Pull-down circuit 282 receives the complement of the data input signals, that is, $\overline{d0}$ and $\overline{d1}$, via inverters 306 and 308, respectively. Because pull-down circuit 282 is the same as pull-down circuit 280 that was described above, pull-down circuit 282 will not be described.

Figure 8:
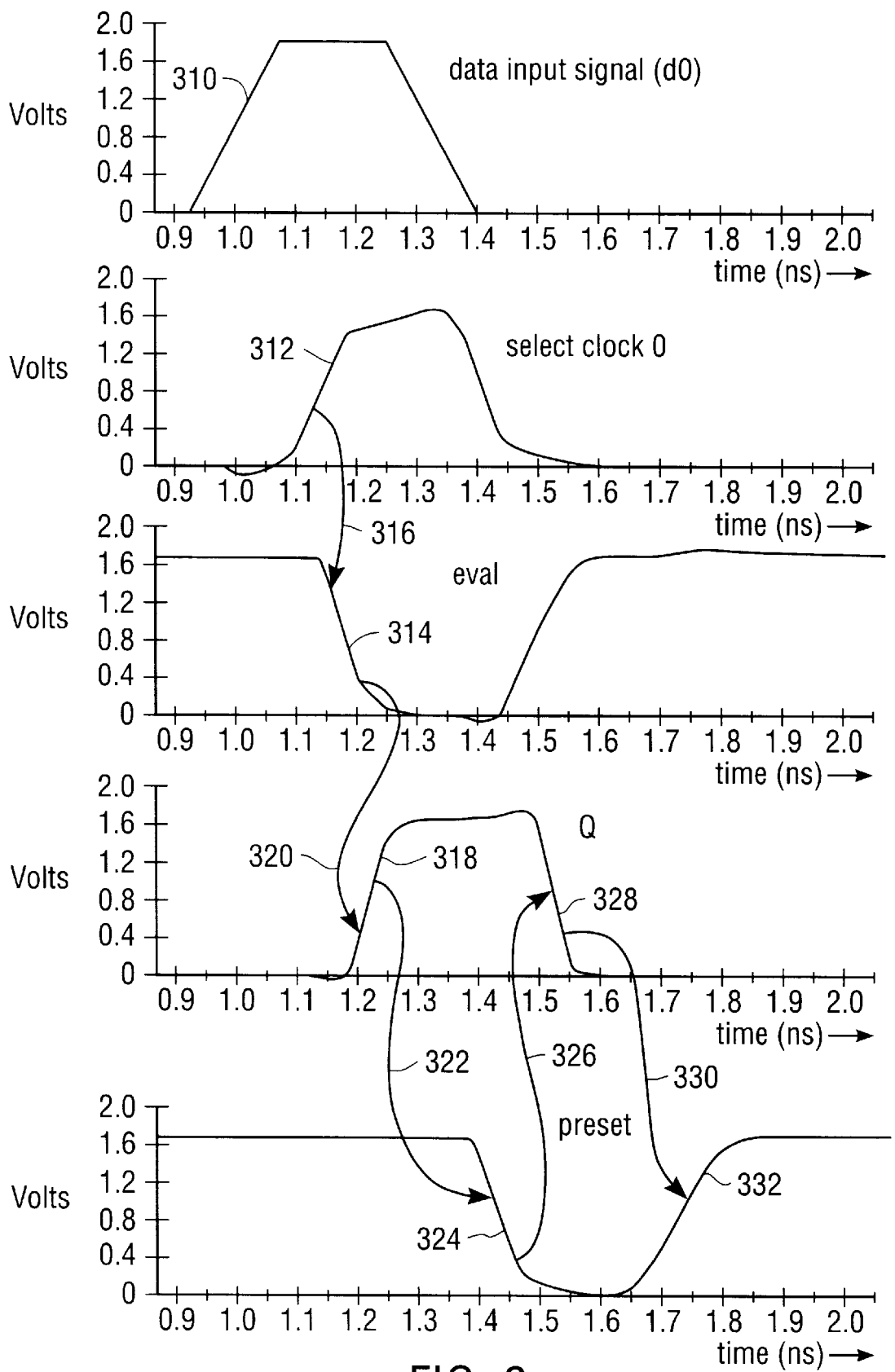
FIG. 8 is a timing diagram of the pulse generator of FIG. 7.

FIG. 8 is a timing diagram of the pulse generator of FIG. 7 showing the relationship between the data input signal (d0), the select-clock signal (select clock 0), the evaluation signal (eval), the output signal Q and the p-reset signal. In this example, the select-clock 1 signal (selclk1) and data input signal d1 have a digital low value, thus transistors 300 and 304 will be inactive. In addition, the evaluation signal at line 278 is precharged to a digital high value.

Referring to both FIGS. 7 and 8, the data input signal (d0) transitions to a digital high value at 310 and transistor 302 turns on. The select-clock 0 signal also transitions to a digital high value at 312 causing transistor 298 to turn on, and pulling line 278 and the evaluation signal down to a digital low value at 314, as shown by arrow 316. The cross-coupled inverters, 76 and 78, act as a latch and maintain the evaluation signal at the digital low value. Meanwhile, in response to the transition of the evaluation signal to a digital low value, the Q signal, that is output by inverter 80 of the pulse generator 40, transitions to a digital high value at 318, as shown by arrow 320. In response to the Q signal transitioning to a digital high value, as shown by arrow 322, the p-reset signal, that is generated by the pulse reset circuit 274, transitions to a digital low value at 324. The digital low value of the p-reset signal causes PMOS transistor 88 to turn on an apply a digital high value to line 278 which is latched by inverters 76 and 78 and causes the evaluation signal to have a digital high value. In addition, in response to the digital high value of the evaluation signal, as shown by arrow 326, the Q signal transitions to a digital low value at 328. In response to the transition to the digital low value of the Q signal, as shown by arrow 330, the p-reset signal transitions to a digital high value at 332.

Therefore, a negative edge triggered flip-flop has been provided with reduced complexity and fewer components. For example, in the prior art circuit of FIG. 1, when the clock signal transitions low, the low going signal passes through five components before a pulse appears on the Q signal: inverter 24, NMOS transistor 64, NMOS transistor 58 or 60, NMOS transistor 46, and inverter 80 (See FIG. 1). In the present invention, the low going clock signal passes through four components before a pulse appears on the Q signal: NAND gate 222, NOR gate 224, NMOS transistor 298 or 300, and inverter 80 (See FIGS. 4 and 7).

Although the invention has been described with respect to two data input signals and two select signals, the invention also applies to embodiments having any number (N) of data input and select signals. In one alternate embodiment, the invention has three data input signals and three select signals. In this embodiment, the header circuit has three select clock signal generators that generate three select-clock signals. In the pulse generator, the pull-down circuit has three data-select blocks connected in parallel.

The present invention provides a noteworthy negative edge triggered flip-flop. The invention is particularly useful in digital circuits that store data on both edges of a clock signal because the invention significantly improves the speed at which data can be stored on the negative clock edge. Performance gains are realized because the invention integrates the clock and select signals in the header circuit.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

What is claimed is:

1. A negative edge triggered flip-flop, comprising:
    a first set of nodes receiving data input signals;
    a second set of nodes receiving select input signals for selecting one data input signal of said data input signals as a selected data input signal;
    a clock node receiving a clock signal having a positive edge and a negative edge;
    an output node;
    a header circuit connected to said second set of nodes and to said clock node, said header circuit integrating said clock signal with said select input signals to generate at least one control signal; and
    a pulse generator circuit connected to said first set of nodes, said header circuit and said output node, said pulse generator circuit generating an output pulse on said output node in response to said at least one control signal and said selected data input signal, such that said output pulse is generated in response to said negative edge of said clock signal.

2. The negative edge triggered flip-flop of claim 1 wherein said header circuit integrates said clock signal with said select input signals by combining said clock signal with one of said select input signals to generate a select-enable signal, then combining said select-enable signal with said clock signal to generate said at least one control signal.

3. The negative edge triggered flip-flop of claim 2 wherein said header circuit combines said clock signal with one of said select input signals by performing a NAND operation to generate said select-enable signal.

4. The negative edge triggered flip-flop of claim 3 wherein said header circuit generates said at least one control signal by performing a NOR operation between said select-enable signal and said clock signal.

5. The negative edge triggered flip-flop of claim 1 wherein said pulse generator circuit includes:
    a multiplexor circuit multiplexing said data input signals with said at least one control signal wherein said one of said at least one control signals results in the state of said selected data input signal being output as an evaluation signal, and
    an output pulse generator generating an output pulse when said evaluation signal has a predetermined digital value.

6. The negative edge triggered flip-flop of claim 1 wherein said header circuit integrates said select input signals with said clock signal to generate said at least one control signal such that one of said at least one control signals is active synchronously with said clock signal, the other control signals being inactive; and said pulse generator circuit generates said output pulse in response to said active control signal.

7. A negative edge triggered flip-flop, comprising:
    a plurality of data input nodes receiving data input signals;
    at least one data output node;
    a plurality of select input nodes receiving select input signals to select one of said data input signals as a selected data input signal;
    a clock input node receiving a clock signal;
    a header circuit receiving said clock signal and said select input signals, said header circuit having a set of header output nodes to output a set of select-clock signals; and
    a pulse generator circuit receiving said data input signals from said data input nodes, said pulse generator circuit being coupled to said set of header output nodes to receive said set of select-clock signals, and generating at least one output pulse on said at least one data output node in response to said set of select-clock signals.

8. The negative edge triggered flip-flop of claim 7 wherein said header circuit includes a plurality of select-clock signal generators, each select-clock signal generator being coupled to one of said header output nodes, each select-clock signal generator receiving said clock signal and one of said select input signals and outputting said select-clock signal on said coupled header output node.

9. The negative edge triggered flip-flop of claim 8 wherein said select-clock signal generator includes:
    a NAND gate receiving one of said select input signals and an enable signal, said NAND gate outputting a select-enable signal; and
    a NOR gate receiving said select-enable signal and said clock signal to output said select-clock signal.

10. The negative edge triggered flip-flop of claim 7 wherein said pulse generator circuit includes:
    at least one pull-down circuit coupled to said header output nodes to receive said select-clock signals, said at least one pull-down circuit also being coupled to said data input nodes to receive said data input signals, and outputting a digital low signal when one of said data input signals and one of said select-clock signals are at a digital high signal; and
    a dynamic pulse generation circuit generating said at least one output pulse in response to said digital low signal output by said at least one pull-down circuit.

11. The negative edge triggered flip-flop of claim 10 wherein said at least one pull-down circuit comprises a plurality of stacked transistor pairs connected in parallel, said stacked transistor pairs having a first transistor connected in series with a second transistor, a gate of said first transistor being connected to one of said header output nodes to receive one of said select-clock signals, a gate of said second transistor being connected to one of said data input nodes to receive one of said data input signals.

12. The negative edge triggered flip-flop of claim 11 wherein each of said stacked transistor pairs is coupled to a precharge transistor.

13. The negative edge triggered flip-flop of claim 1 wherein said dynamic pulse generation circuit includes:
    a latch temporarily storing said output of said pull-down circuit; and
    a pulse reset circuit generating a p-reset signal to reset said latch to a digital high value in response to said at least one output pulse.

14. A negative edge triggered flip-flop, comprising:
    a plurality of data input nodes receiving data input signals;

at least one data output node;

a plurality of select input nodes receiving select input signals to select one of said data input signals as a selected data input signal;

a clock input node receiving a clock signal;

a plurality of select-clock signal generators coupled to a plurality of header output nodes, each select-clock signal generator being coupled to one of said header output nodes, each select-clock signal generator outputting a select-clock signal on said coupled header output node based on said clock signal and one of said select input signals;

at least one pull-down circuit coupled to said header output nodes, each pull-down circuit receiving said select-clock signals, each pull-down circuit also receiving said data input signals, and outputting a digital low value when said selected data input signal is at a digital high value; and at least one dynamic pulse generation circuit generating an output pulse in response to said digital low value output by said at least one pull-down circuit.

15. The negative edge triggered flip-flop of claim 14 wherein said select-clock signal generator includes:

a NAND gate receiving one of said select input signals and an enable signal, said NAND gate outputting a select-enable signal; and a NOR gate receiving said select-enable signal and said clock signal, said NOR gate performing a NOR operation between said select-enable signal and said clock signal to output said select-clock signal.

16. The negative edge triggered flip-flop of claim 14 wherein said at least one pull-down circuit comprises a plurality of stacked transistor pairs connected in parallel, said stacked transistor pairs having a first transistor and a second transistor, said first transistor being receiving one of said select-clock signals from one of said header output nodes, said second transistor receiving one of said data input signals from one of said data input nodes.

17. The negative edge triggered flip-flop of claim 16 wherein said first transistor and said second transistor are connected in series, and said second transistor is coupled to said dynamic pulse generation circuit.

18. The negative edge triggered flip-flop of claim 16 wherein each of said stacked transistor pairs is coupled to a precharge transistor.

19. A computer system comprising:

a memory storing data; and a processor, coupled to said memory, said processor including at least one flip-flop comprising:

a first set of nodes receiving data input signals corresponding to said data retrieved from said memory, a second set of nodes receiving select input signals for selecting one data input signal of said data input signals as a selected data input signal, a clock node receiving a clock signal having a positive edge and a negative edge, an output node, a header circuit connected to said second set of nodes and to said clock node, said head circuit integrating said clock signal with said select input signals to generate at least one control signal, and a pulse generator circuit connected to said first set of nodes, said header circuit and said output node, said pulse generator circuit generating an output pulse on said output node in response to said at least one control signal and said selected data input signal, such that said output pulse is generated in response to said negative edge of said clock signal.

20. The negative edge triggered flip-flop of claim 19 wherein said header circuit integrates said clock signal with said select input signals by combining said clock signal with one of said select input signals to generate a select-enable signal, then combining said select-enable signal with said clock signal to generate said at least one control signal.

* * * * *